United States Patent [19]

Sasaki et al.

[11] Patent Number: 4,580,046
[45] Date of Patent: Apr. 1, 1986

[54] DISPLACEMENT MEASURING DEVICE UTILIZING AN INCREMENTAL CODE

[75] Inventors: Tsuneo Sasaki; Fumio Ohtomo; Takashi Yokokura; Fumitomo Kondo, all of Tokyo, Japan

[73] Assignee: Tokyo Kogaku Kikai Kabushiki Kaisha, Tokyo, Japan

[21] Appl. No.: 696,049

[22] Filed: Jan. 29, 1985

Related U.S. Application Data

[62] Division of Ser. No. 453,880, filed as PCT JP82/00119, Apr. 12, 1982, published as WO82/03682, Oct. 28, 1982, § 102(e) date Dec. 10, 1982.

[30] Foreign Application Priority Data

Apr. 13, 1981 [JP] Japan ................................. 56-55405

[51] Int. Cl.$^4$ ............................................. G01D 5/38
[52] U.S. Cl. ......................... 250/231 SE; 250/237 G; 324/175; 340/347 P
[58] Field of Search .................. 250/231 SE, 237 G; 340/347 P; 324/173-175; 356/375, 395

[56] References Cited

U.S. PATENT DOCUMENTS 3,639,753 2/1972 Reich ............................... 324/173 X

OTHER PUBLICATIONS

Cornish, "Optoelectronics Applied to Variable Speed Drives", Electronic Engineering, Oct. 1974, pp. 18–19.

Primary Examiner—Edward P. Westin
Attorney, Agent, or Firm—Brumbaugh, Graves, Donohue & Raymond

[57] ABSTRACT

A displacement measuring device, using an incremental code, which includes a coding member (22) resting on the object (21) to be measured and having a coding section for generating such signals that a sensing element can discriminate the signals as 0 or 1, sensing means (25A, 25B) disposed to sense the coding section of the coding member for producing sensed signals in response to the displacement of the coding member (22), and rectangular wave-converting circuits (27A, 27B) for receiving and converting the sensed signal into rectangular wave signals. A clock pulse generator (28) is provided in the device for generating a clock pulse with a higher repetition-frequency than the repetition-frequency of the sensed signal. An edge detector (29) receives the clock pulse from the clock pulse generator (28) and the rectangular wave-signal from the rectangular wave-converting circuits (27A, 27B) and then delivers, as an output pulse, the clock pulse substantially coincident with at least one of the leading edge and the trailing edge of the rectangular wave-signal. A counter (30) counts the output pulses from the edge detector and a display (31) indicates the counted value. With such an arrangement, an incremental displacement measurement can be made without a differentiating circuit and an averaging circuit.

4 Claims, 24 Drawing Figures

DISPLACEMENT MEASURING DEVICE UTILIZING AN INCREMENTAL CODE

This application is a division of application Ser. No. 453,880, filed on Dec. 10, 1982.

TECHNICAL FIELD

This invention relates to devices for measuring displacement, and particularly to devices for measuring displacement of the type which employs a coding member which is provided to an object to be measured and has a coding section capable of causing sensing elements to generate signals which can be discriminated as "0" and "1", and sensing means adapted to sense the coding section of the coding member for generating detection signals in response to displacement of the coding member. More particularly, the invention relates to the above-mentioned type of displacement measuring device which can be effectively used in an angular displacement measuring equipment wherein measurement error due to play and/or eccentricity in the rotating shaft of an object to be measured can be compensated whereby rotational angle or rotating speed of the rotating body can be measured with high accuracy.

BACKGROUND

Conventionally, a device for measuring the rotational angle of a rotating body with influence due to play and/or eccentricity in the rotating shaft being eliminated, has been known and described in Japanese Patent Application Pre-examination Public Disclosure No. Sho 55-67608 published on May 21, 1980. The rotational angle measuring device which is described as prior art in this public disclosure is a photoelectric rotational angle measuring device as shown in the block diagram of FIG. 1, wherein a rotating coding disk 2, which has radial slit gratings 2A arranged annularly at equal angular pitches P as shown in FIG. 2, is fixed to a rotating shaft 1, which is an object to be measured, for rotation together with the rotating shaft 1, with the slit gratings in a substantially concentric relationship with the rotating shaft 1. Opposed to and concentrically with the rotating disk 2, an unrotatable index disk 3 is provided. This index disk 3 is provided with two groups of index slit gratings 3A, 3B arranged in a diametrically opposing relationship ship with an angular difference of $$\frac{2n+1}{2} P$$

(wherein n is an integer) therebetween as shown in FIG. 3. Light sources 4A, 4B and photoelectric conversion element 5A, 5B are located to put therebetween the index gratings 3A, 3B and the rotating code disk 2. Upon rotation of the rotating shaft 1, sinusoidal signals as indicated from the photoelectric conversion elements 5A, 5B. The output signals from the photoelectric conversion elements 5A, 5B are directly supplied to a differential amplifier 6 for cancelling direct current components in the respective signals, and then supplied to a Schmitt circuit 7 where the signal is converted into rectangular waves, which are in turn converted by a pulse generating circuit 8 into pulses which correspond to the leading or trailing edges of the rectangular waves. The pulses generated from the pulse generating circuit 8 are counted by a counter 9, and the counted value is converted into a rotational angle of the rotating shaft 1 and is displayed by a display unit 10.

The pulse generating circuit 8 of the above-described conventional rotational angle measuring device has been composed from a differentiating circuit employing a capacitor and a resistor for deriving pulses which correspond to the leading or trailing edge or both edges of a detection signal.

The capacitor and resistor employed in the differentiating circuit, however, are highly dependent on temperature, and thus the threshold level may be varied by the influence of variation of temperature to cause an error, resulting in decreased reliability. Further, differentiating circuits of the number corresponding to the necessary number of edge detections are required, resulting in an increased number of components. Because of this and because capacitors and resistors cannot be easily realized in an integrated circuit, the construction of an electronic circuit is inevitably complicated and is prevented from being small-sized.

On the other hand, the above-described conventional device, even if output signals of the photoelectric conversion elements 5A, 5B would shift in phase from signals of reference (0°) phases (represented as $E \sin \omega t$ and $E \sin (\omega t + \pi)$, respectively) because of play of the rotating shaft 1 and eccentricity in the rotating shaft 1 and the disk 2, since the index gratings 3A, 3B are located in a diametrically opposing fashion, that is, at rotationally symmetrical positions, these phase shifts will be of an equal amount $\psi$ in opposite directions with respect to each other, as shown at 4A, 4B in FIG. 4. Accordingly, output signals of the photoelectric conversion elements 5A, 5B will be of $E \sin (\omega t + \psi)$ and $E \sin (\omega t + \pi - \psi)$, respectively, as indicated at 4A, 4B in FIG. 4, and differential signal of the outputs of the photoelectric conversion elements 5A, 5B will be of $2E \cos \psi \sin \omega t$ as seen at 4C in FIG. 4. Consequently, digital processing will be made on the basis of a signal with phase shift having compensated.

In the above-described conventional device, however, since the differential signal of output signals of the photoelectric conversion elements 5A, 5B is $2E \cos \psi$ in amplitude as indicated at 4C in FIG. 4, when $\psi$ is near 90° due to, for example, some amount of play and/or eccentricity in the rotating shaft 1, the magnitude of the differential signal will become almost zero, resulting in an erroneous counting of the number of pulses. For example, when a grating plate having $10\mu$ pitches is used, a largest deviation of $4\mu$ will appear at the center if there is an eccentricity of $2\mu$, and accordingly it is apparent that there is a portion which is affected by an eccentricity of up to $10\mu \times \frac{1}{4}$ period, i.e. $2.5\mu$, or more, so that an erroneous counting would occur.

In order to avoid the above-described drawbacks, the above-mentioned Japanese Patent Application Preexamination Public Disclosure discloses a rotational angle measuring device as shown in FIG. 5. In FIG. 5, similar parts to those in FIG. 1 are indicated by like symbols. This rotational angle measuring device comprises, as shown in FIG. 5, a rotating shaft 1, a rotating disk 2, an index disk 3, light sources 4A and 4B, and photoelectric conversion elements 5A, 5B, which are similar in construction to those in FIG. 1. Output signals of the photoelectric conversion elements 5A, 5B are converted by Schmitt trigger circuits 11A, 11B into rectangular waves, which are then converted by pulse generating circuits 12A, 12B into pulses which correspond to the leading and trailing edges of the rectangular waves.

These pulses are counted respectively by counters 13A, 13B, and the counted values are averaged by an averaging circuit 14 for displaying rotational angle of the rotating body by a display unit 10.

In the device of FIG. 5, however, there is a disadvantage that, if the averaging circuit 14 would be constructed from hardware, then the construction will be complicated very much. Alternatively, if the averaging process would be performed by means of software, then there is also a disadvantage that the processing speed will become a problem, and real-time display of rotational angle is sometimes impossible. Further, in this device, there is a disadvantage that, as is seen from FIG. 5, there are required two series of identical circuits, which include the pulse generating circuits 12A, 12B composed of differentiating circuits as described above, and the counters 13A, 13B, thus becoming as much complicated and uneconomical.

Further, individual code elements, which are provided in a coding member such as the rotating disk 2 employed in this type of rotational angle measuring device, are identical to each other, as in the case of the slit gratings 2A, and therefore cannot be distinguished individually. Accordingly, by counting detection signals, an amount of displacement such as a rotational angle can be obtained as described above. That is to say, this type of codes is a so-called incremental type. This incremental type of codes is the one which is to be contrasted with a so-called absolute type of codes wherein discriminatable codes are provided on one-by-one basis in a coding member taking a predetermined absolute origin as the reference, so that a position can be known only by reading the particular code. The absolute type of codes is high in reliability, but is complicated in construction and expensive. Accordingly, the incremental type of codes, which is simpler in construction than the absolute type, is widely employed.

In displacement measurement using the incremental type of codes, an erroneous counting of detection signals becomes, just as it is, a measurement error, which is a main reason that the incremental type is said to be lower in reliability than the absolute type. Such erroneous counting occurs, when an coding member moves at a speed higher than the response speed of an detecting means, when output of the detecting means decreases, or when, in a measuring device having a plurality of detection elements located so that the detection signals may have a phase difference for example 90° to each other in order to make a fine signals, which should precisely be 90°, becomes extremely large or extremely small. Practically, erroneous counting, which occurs due to a too high speed displacement of the coding member, depends on response speed of the detection means determined by the characteristic of elements and circuit used, and therefore cannot be avoided. Erroneous counting due to variation in phase difference can be considered that it results from the fact that intervals between pulses, which represent the leading or trailing edges or both edges of first and second detection signals that should be shifted from each other by a predetermined phase difference, become smaller, so that the counter becomes unable to discriminate the pulses from each other, thereby missing in accurate counting. Causes of such phase shift can be considered to be positional shifts of the coding member, the index slit and the light emitting element in case of optical detection, and to be positional shifts of the coding member and the magnetic detection element in case of magnetic detection. Decreased output of the detection means makes it difficult for the detection signals to be encoded into codes of "0" and "1", resulting in an erroneous counting. Such decreased output of the detection means can be considered to be caused by soils on the light emitting portion, the coding member, decrease in the voltage applied to the light emitting element, and abnormality in the light emitting element or in the light receiving element in case of optical detection, and to be caused by soils on the surface of the magnetic material on the coding member, increase in the distance between the code member and the magnetic detection element, and abnormality in the magnetic detection element in case of magnetic detection.

In the past, however, no countermeasure has been devised against such problem of erroneous counting except Japanese Patent Application Pre-examination Public Disclosure No. Sho 55-42324 published on Dec. 30, 1980, which discloses a circuit which is adapted to always compare output of detection means with a predetermined level, and offer an alarm when the output of detection means has decreased. In the alarm circuit disclosed in this Public Disclosure, however, if the output of detection means would include therein a noise exceeding the predetermined level, it then makes a judgement that there is no abnormality, because such noise exceeds the predetermined level, and accordingly it is insufficient in reliability for level detection.

Accordingly, this invention is intended to provide a displacement measuring device which employs no differentiating circuit comprising a capacitor and a resistor.

Furthermore, this invention is intended to provide a displacement measuring device which eliminates the drawbacks and complexity in the above-described conventional devices, and can be used in an angular displacement measuring equipment which can measure rotational angle and rotational speed with high accuracy, with a simple construction, and without being affected by play and/or eccentricity in the rotating shaft of a rotating body.

Also, this invention is intended to provide a displacement measuring device which is adapted to give an alarm of erroneous counting such as described above.

In particular, a first object of this invention is to provide a displacement measuring device which employs a clock pulse generator in place of a differentiating circuit, so that clock pulses, which substantially coincide in time with predetermined states such as the zero crossing leading or trailing edges of detection signals from detecting means, are drawn out, and the drawn-out clock pulses are counted to make a measurement of an amount of displacement.

A second object of the invention is to provide a displacement measuring device which employs no averaging circuit and is simple in construction such that only one up-down counter suffices in number, and which can constitute an angular displacement measuring equipment which is not affected by play and/or eccentricity in a rotating shaft.

A third object of this invention is to provide a displacement measuring device which gives an alarm at the time when displacement speed of an object under measurement exceeds a predetermined value.

A fourth object of the invention is to provide a displacement measuring device adapted to generate an alarm when the phase difference between first and second detection signals from first and second detection means, which should be shifted from each other by a predetermined phase difference, has become smaller than the predetermined value.

A fifth object of the invention is to provide a displacement measuring device wherein, in order to discriminate with high accuracy whether output of detection means is larger than a predetermined value, detection signals are compared with a reference value at the time when the detection signal takes the maximum or minimum value, thereby to give an alarm.

DISCLOSURE OF THE INVENTION

According to this invention, there is provided an apparatus for measuring displacement, characterized in that it comprises: a coding member which is provided to an object to be measured and has a coding section capable of causing detection elements to generate signals which can be discriminated as "0" and "1", sensing means arranged to sense the coding section of the coding member and adapted to generate detection signals according to displacement of the coding member; rectangular wave-converting means for receiving the detection signals to generate rectangular wave signals; clock pulse generating means for generating clock pulse having higher repetition-frequency than the repetition-frequency of the detection signals; edge detecting means for receiving the rectangular wave signals and the clock pulses to generate, as output pulses, clock pulses which substantially coincide with at least one of the leading and trailing edges of the rectangular wave signals; a main counter for counting the output pulses from the edge detecting means; and a display unit for displaying the counted value of the main counter.

With such a construction employing a digital circuit which has little dependence on, instead of employing a differentiating circuit comprising a capacitor and a resistor, there can be obtained an electronic circuit for a displacement measuring device which is less affected by temperature variation, has an increased reliability, and is simple and compact in construction because of a decreased number of components required.

The displacement measuring device in accordance with this invention can be used for measuring linear displacement and also for measuring angular displacement. For example, in case of measuring the elevation angle, i.e. altitude angle, and the horizontal angle in a transit, a disk-shaped coding member having an annular coding section is attached to a rotating shaft and sensing means are arranged opposite to the coding section. In case of measuring the amount of displacement of a linearly moving member of a machine tool, a coding member having a coding section arranged linearly therein, for example, is provided to the linearly moving member, and sensing means are arranged opposite to the coding section.

The coding member used in the displacement measuring device in accordance with this invention may be of either the optical type or the magnetic type. In case of the magnetic type, the coding section of a coding member is formed with magnetic segments arranged in a grating fashion, for example, and magnetic heads may be employed as sensing means. On the other hand, the optical type includes a transmission type and a reflection type. In case of the transmission type, light-passing portions such as slits are formed at equal intermals in the coding section of a coding member, so that light sources such as light emitting elements are positioned on one side of the coding section of the coding member, and light receiving elements are positioned on the other side as sensing means, the coding section being interposed between the light sources and the light receiving elements. In case of the reflection type, reflective portions and non-reflective portions are alternately provided in the coding section of a coding member, light sources such as light emitting elements are arranged in a manner that they may illuminate the coding section, and light receiving elements are arranged, as sensing means, at positions where they may receive reflected light from the reflective portions.

The above described embodiment of the displacement measuring device in accordance with this invention further comprising a speed detection device, which has a counter adapted to receive output pulses from the edge detecting means for counting the output pulses, and a frequency divider adapted to receive and frequency-divide clock pulses from the clock pulse generating means so as to output a clear signal to the counter, thereby to output the output of the counter as an information representing displacement speed of the coding member. Preferably, this speed detection device may further have a speed setting unit for setting the upper limit of displacement speed, and a comparator for receiving counted output from the counter and a set value from the upper limit speed setting unit so as to generate a signal when the counted value has exceeded the set value. When the comparator has generated the signal, it is displayed by the display unit. By so doing, the operator can know the possibility of an erroneous counting due to a too rapid displacement, and can obtain an arcurate measured value by displacing the object under measurement again at a lower speed.

A further embodiment of the displacement measuring device in accordance with this invention further comprises a counter adapted to receive and count clock pulses from the clock pulse generating means and to be cleared by an output pulse from the edge detection means, thereby to output the counted value as an information representing time per unit amount of displacement.

In a further embodiment of the displacement measuring device in accordance with this invention, the coding member is a rotating disk joined to a rotating shaft that is an object to be measured, and the coding section of the coding member is annularly provided in the rotating disk. The sensing means has first and second sensing elements arranged in a diametrically opposing fashion with respect to the rotating disk and adapted to respectively generate first and second detection signals, and the rectangular wave-converting means has first and second rectangular wave converting circuits adapted to receive the first and second detection signals for respectively outputting first and second rectangular wave signals. The clock pulse generating means is adapted to generate first and second clock pulses which are the same in frequency but different in phase so that the moments when they are at high level may not coincide with each other. The edge detecting means is adapted to receive both of the first and second rectangular wave signals and both of the first and second clock pulses for outputting, as output pulses, first clock pulses substantially coinciding with the leading and trailing edges of the first rectangular wave signal and second pulses substantially coinciding with the leading and trailing edges of the second rectangular wave signal. With such a construction, no averaging circuit is required, and only one up-down counter suffices in number. The angular displacement can be measured without being affected by play and/or eccentricity in the rotating shaft.

In a still further embodiment of the displacement measuring device in accordance with this invention, the sensing means has first and second sensing elements arranged for generating first and second detection signals having a phase difference of 90° to each other in response to displacement of the coding member, and the rectangular wave-converting means has first and second rectangular wave-converting circuits which respectively receive the first and second detection signals for respectively outputting first and second rectangular wave signals. Further, there is provided a direction discrimination unit for receiving the first and second rectangular wave signals to generate a direction signal indicating the direction of displacement of the coding member. The edge detecting means is adapted to receive at least one of the first and second rectangular wave signals and the clock pulses for generating, as output pulses, clock pulses which substantially coincide with at least one of the leading and trailing edges of the rectangular wave signal. The main counter is an up-and-down counter for incrementally/decrementally counting output pulses from the edge detector in accordance with the direction signal from the direction discrimination unit.

In this case, the edge detecting means may also be adapted to receive both of the first and second rectangular wave signals and the clock pulses for outputting, as output pulses, clock pulses which substantially coincide with the leading and trailing edges of the first and second rectangular wave signals. By so doing, displacement measurement can be made with putted a clock pulse which substantially coincides with the leading or trailing edge of only one of the rectangular wave signals.

In a further embodiment of the displacement measuring device in accordance with this invention, the clock pulse generating means is designed to generate first and second clock pulses which are the same in frequency but are different in phase so that the moments when they are at high level may not coincide with each other, and the edge detecting means is constructed to receive both of the first and second rectangular wave signals and both of the first and second clock pulses for outputting, as output pulses, first clock pulses which substantially coincide with the leading and trailing edges of the first rectangular wave signal and second clock pulses which substantially coincide with the leading and trailing edges of the second rectangular wave signal. With such arrangement, the clock pulses which substantially coincide with the leading and trailing edges of the first rectangular wave signal and the clock pulses which substantially coincide with the leading and trailing edges of the second rectangular wave signal will not coincide in time with each other, and thus correct measurement can be made even if the displacement speed of the object to be measured is high.

A still further embodiment of the displacement measuring device in accordance with this invention further includes a phase detection device comprising a counter adapted to count clock pulses from clock pulse generating means and be cleared by an output pulse from the edge detecting means, a phase difference setting unit, and a comparator for receiving the counted value from the counter and a set value from the phase difference setting unit to output an abnormality signal when the counted value has exceeded the set value. When the comparator of the phase detection device has outputted a signal, it is displayed by the display unit. With such arrangement, the operator can know possibility of erroneous counting caused by decrease in the interval between the output pulses from the edge detector due to decrease in the phase difference between the first and second detection signals which should have therebetween a phase difference of 90°. Accordingly, the operator can obtain a correct measured value of displacement by making necessary adjustment and maintenance for eliminating the cause of such change in phase difference and by making a measurement again.

In a further embodiment of the displacement measuring device in accordance with this invention, the edge detecting means is arranged such that it outputs, as first output pulses, clock pulses which substantially coincide with the leading and trailing edges of the first rectangular wave signal, and also outputs, as second output pulses, clock pulses which coincide with the leading and trailing edges of the second rectangular wave signal. In addition the displacement measuring device also comprises an output detection device consisting of a pair of output detectors which respectively receive the first and second detection signals to compare the levels of the respective detection signals with a reference level at a timing coinciding with an output pulse obtained from the other detection signal having a 90° phase difference with respect to the first-mentioned detection signal. Each of the output detectors generates a signal when the level of the detection signal is smaller than the reference value, and when each output detector outputs the signal, it is displayed by a display unit. Preferably, each output detector includes a first comparator for comparing the detection signal with a maximum reference level, and a second comparator for comparing the detection signal with a minimum reference level. With such arrangement, since the detection signal is compared with the reference level when the detection signal takes the maximum or minimum value, whether the detection signal is larger or smaller than the reference level can be certainly determined without being affected by noise. And, when an abnormality display has been made, the operator can obtain a correct measured value of displacement by making necessary adjustment and maintenance for eliminating the cause of such decreased output and by making a measurement again.

In case of applying the above-described displacement measuring device in accordance with this invention to a rotational angle measuring equipment, the coding member is composed from a rotating disk, which is joined to the rotating shaft of an object to be measured and is provided with an coding section in an annular fashion, and the first and second sensing elements of the sensing means are arranged with respect to the coding section of the rotating disk such that they respectively output first and second detection signals having therebetween a 90° phase difference in response to rotational motion of the rotating disk.

In a further embodiment of the displacement measuring device in accordance with this invention, the coding member is a rotating disk joined to the rotating shaft of an object to be measured, and the coding section is provided in the rotating disk in an annular fashion. The sensing means has first and second sensing means arranged with respect to the rotating disk in a manner that they are diametrically opposed to each other. The first sensing means has at least first and second sensing elements arranged for respectively generating first and second detection signals with a 90° phase difference therebetween in response to rotational motion of the rotating disk, and the second sensing means has at least third and fourth sensing elements arranged for respectively generating third and fourth detection signals with a 90° phase difference therebetween in response to rotational motion of the rotating disk. The rectangular wave-converting means has first, second, third and fourth rectangular wave-converting circuits which respectively receive the first, second, third and fourth detection signals for respectively generating first, second, third and fourth rectangular wave signals. Further a direction discrimination unit is provided for receiving the first and second rectangular wave signals to generate a direction signal indicating the direction of displacement of the coding member. The clock pulse generator means is adapted to generate first and second clock pulses which are the same in frequency but are different in phase so that the moments when they are at high level will not coincide with each other, and the edge detecting means has a first edge detector adapted to receive both of the first and second rectangular wave signals and the first clock pulses for outputting, as first output pulses, first clock pulses substantially coinciding with the leading and trailing edges of the respective first and second rectangular wave signals, and a second edge detector adapted to receive both of the third and fourth rectangular wave signals and the second clock pulses for outputting, as second output pulses, second clock pulses substantialy coinciding with the leading and trailing edges of the respective third and fourth rectangular wave signals. The main counter is an up-and-down counter for incrementally/decrementally counting the first and second output pulses from the edge detection means in accordance to the direction signal from the direction discrimination unit. With such arrangement, no averaging circuit is used and only one up-down counter suffices in number. On the other hand, angular displacement can be accurately measured without being affected by play and/or eccentricity in the rotating shaft.

Further, according to the invention, in a displacement measuring device comprising a coding member which is provided to an object to be measured and has an coding section capable of causing sensing elements to generate signals which can be discriminated as "0" and "1", and at least first and second sensing means which are arranged for sensing the coding section of the coding member and are adapted to respectively generate first and second detection signals deviated from each other by a predetermined phase difference in response to displacement of the code member, thereby to judge from the first and second detection signals the direction of displacement and to count at least one of the first and second detection signals for measuring displacement, there are provided a phse difference detection device which has a phse difference detector for receiving the first and second detection signals to detect a phase difference therebetween, a discrimination unit for discriminating whether the phase difference detected by the phase difference detection unit is within a predetermined range, and a display unit for making a display when the discrimination unit has judged that the phase difference is out of the predetermined range. An embodiment of this displacement measuring device in accordance with this invention further comprises first and second rectangular wave-converting circuits for respectively receiving the first and second detection signals to respectively generate first and second square rectangular signals, a clock pulse generator for generating clock pulses having higher repetition-frequency than the repetition-frequency of the first and second detection signals, and an edge detector for receiving the first and second rectangular wave signals and the clock pulses to output, as output pulses, pulses which substantially coincide with the leading and trailing edges of the first and second rectangular wave signals. The phase difference detector is composed from a counter which counts the clock pulses and is cleared by the output pulse, and the discrimination unit is composed from a comparator which compares a counted value outputted from the counter with a set value from a phase difference setting unit thereby to output a signal when the counted value has exceeded the set value. With such arrangement, the operator can know the possibility of erroneous measurement which results from the fact that the first and second detection signals, which should be deviated from each other by a predetermined phase difference, are not deviated by such predetermined phase difference. Accordingly, the operator can obtain a correct measured value of displacement by making necessary adjustment and maintenance and making a measurement again.

Moreover, according to the invention, in a displacement measuring device comprising a coding member which is provided to an object to be measured and has an coding section capable of causing sensing elements to generate signals which can be discriminated as "0" and "1", and sensing means arranged for sensing the coding section of the coding member and adapted to generate detection signals in response to displacement of the coding member, so that the detection signals are counted for measuring displacement, there is provided a speed detection device which have a speed detector including a counter adapted to receive and count the detection signals and be cleared every predetermined period of time, a comparator adapted to receive the counted value from the counter and a set value from a speed setting unit for outputting a signal when the counted value has exceeded the set value, and a display unit for making a display when the comparator has outputted the signal. In one embodiment of this displacement measuring device in accordance with this invention, the sensing means has first and second sensing elements for respectively generating first and second detection signals with a 90° phase difference therebetween, and there are further provided first and second rectangular wave-converting circuits for respectively receiving the first and second detection signals to respectively generate first and second rectangular wave signals, a clock pulse generator for generating clock pulses having a higher repetition-frequency than the repetition-frequency of the first and second detection signals, and an edge detector for receiving at least one of the first and second rectangular wave signals and the clock pulses to output, as output pulses, clock pulses which substantially coincide with at least one of the leading and trailing edges of the rectangular wave signal. The counter of the speed detector counts the output pulses from the edge detector and is cleared by a frequency-divided pulse obtained by frequency dividing the clock pulses from the clock pulse generator. With such arrangement, the operator can know the possibility of erroneous measurement due to too rapid displacement, and the operator can obtain a correct measure-

BEST MODES FOR CARRYING OUT THE INVENTION

Figure 1:
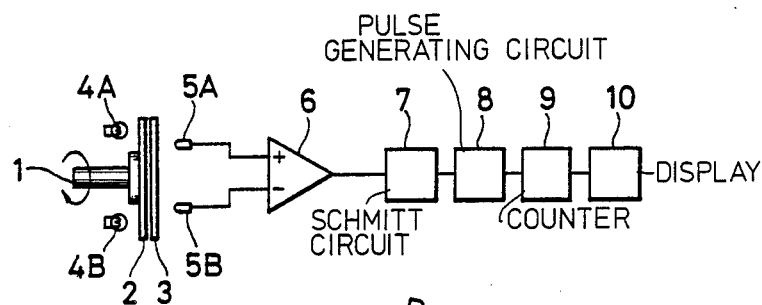
FIG. 1 is a block diagram illustrating the construction of a conventional device for measuring rotational angle.
Figure 2:
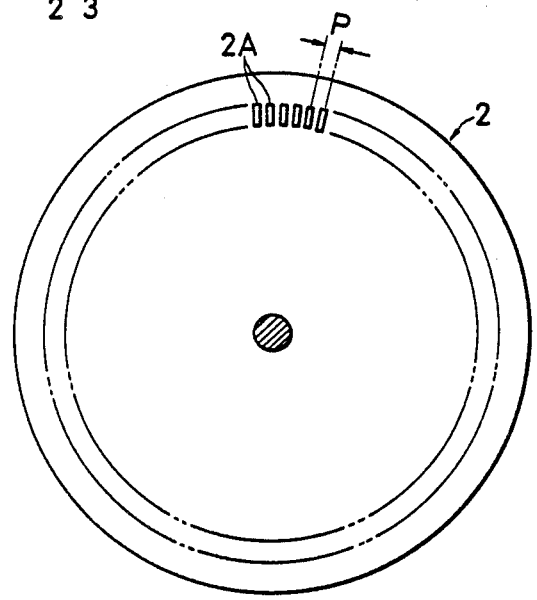
FIG. 2 is a plan view of the rotating coding disk used in the device of FIG. 1.
Figure 3:
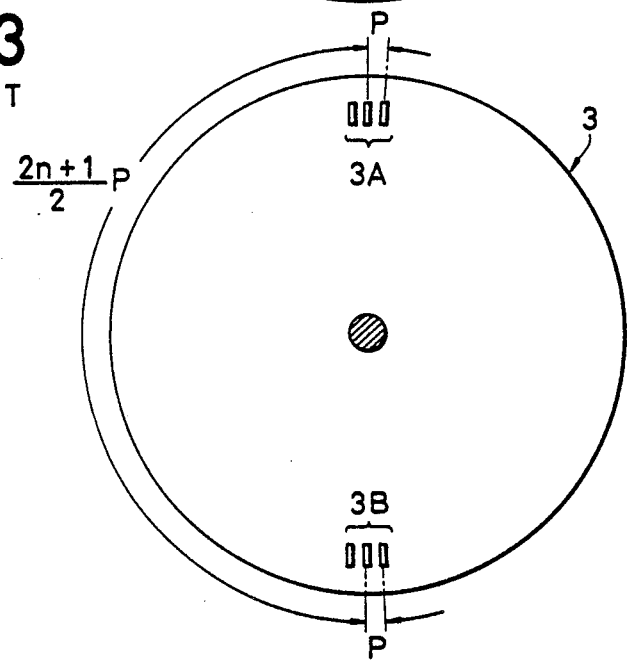
FIG. 3 is a plan view of the index disk used in the device of FIG. 1.
Figure 4:
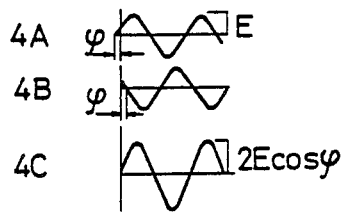
FIG. 4 shows output wave forms of the photoelectric conversion elements used in the device of FIG. 1 and a combined wave form of these output waves.
Figure 5:
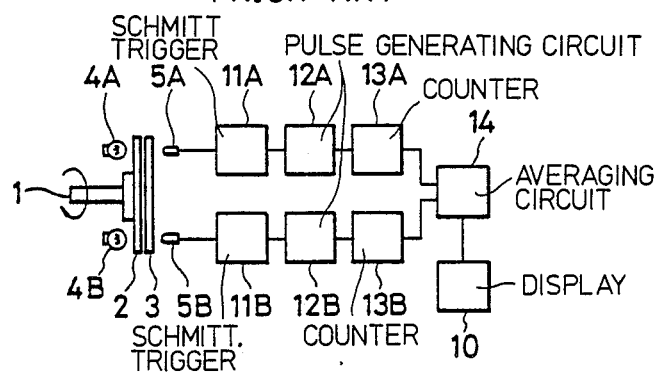
FIG. 5 is a block diagram illustrating the construction of another conventional device for measuring rotational angle.
Figure 6:
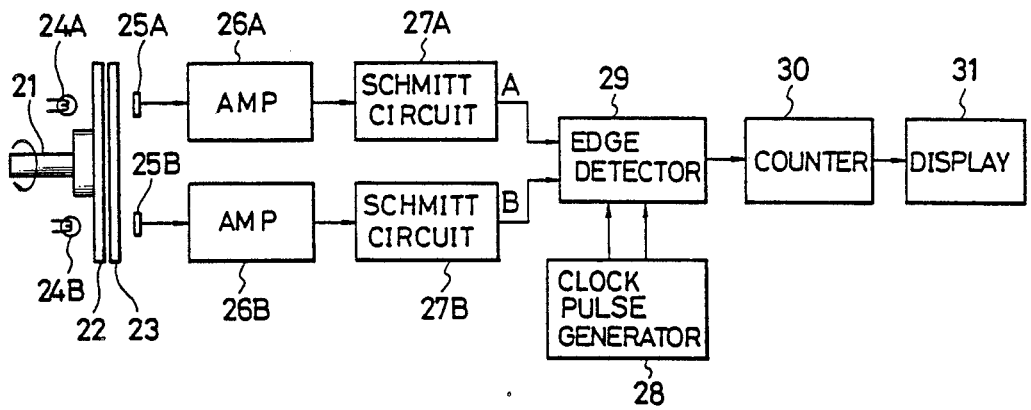
FIG. 6 is a block diagram illustrating the construction of an embodiment of the photoelectric type device for measuring rotational angle in accordance with this invention.

FIG. 6 is a block diagram of an embodiment of the displacement measuring device in accordance with this invention for measuring rotational angles in a photoelectric manner. In FIG. 6, the constructions and arrangements of a rotating shaft 21, a rotating disk 22, an index disk 23, radiation sources such as light sources 24A, 24B, and sensing elements such as photoelectric conversion elements 25A, 25B are substantially the same as those shown in FIGS. 1 and 5. That is to say, the rotating disk 22, which is secured to the rotating shaft 21 of a rotating member in a substantially concentric relationship, is provided with coding patterns arranged annularly at equal angular pitches, i.e., radial optical-through slit gratings, in a similar manner as in the rotating disk shown in FIG. 2. The index disk 23 is located in a substantially concentric relationship with respect to the rotating disk 22, and this index disk 23 is provided, at its rotationally symmetrical locations, i.e. at diametrically opposing locations, with two sets of index pattern, e.g. optical-through index gratings, which face the coding patterns, e.g. the radial gratings, and have index slits arranged at the same pitches as the coding patterns. These index gratings, however, differing from the index disk 3 of FIG. 3, are not always required to meet with the relationship of $$\frac{2n+1}{2} P.$$

The radiation sources, e.g. the light sources 24A and 25B, and the sensing elements, e.g. the photoelectric conversion elements 25A, 25B, which are adapted to sense informations from the radiation sources, are arranged in an opposing relationship to each other, with the index gratings of the index disk 23 and the rotating disk 22 being interposed therebetween.

Figure 7:
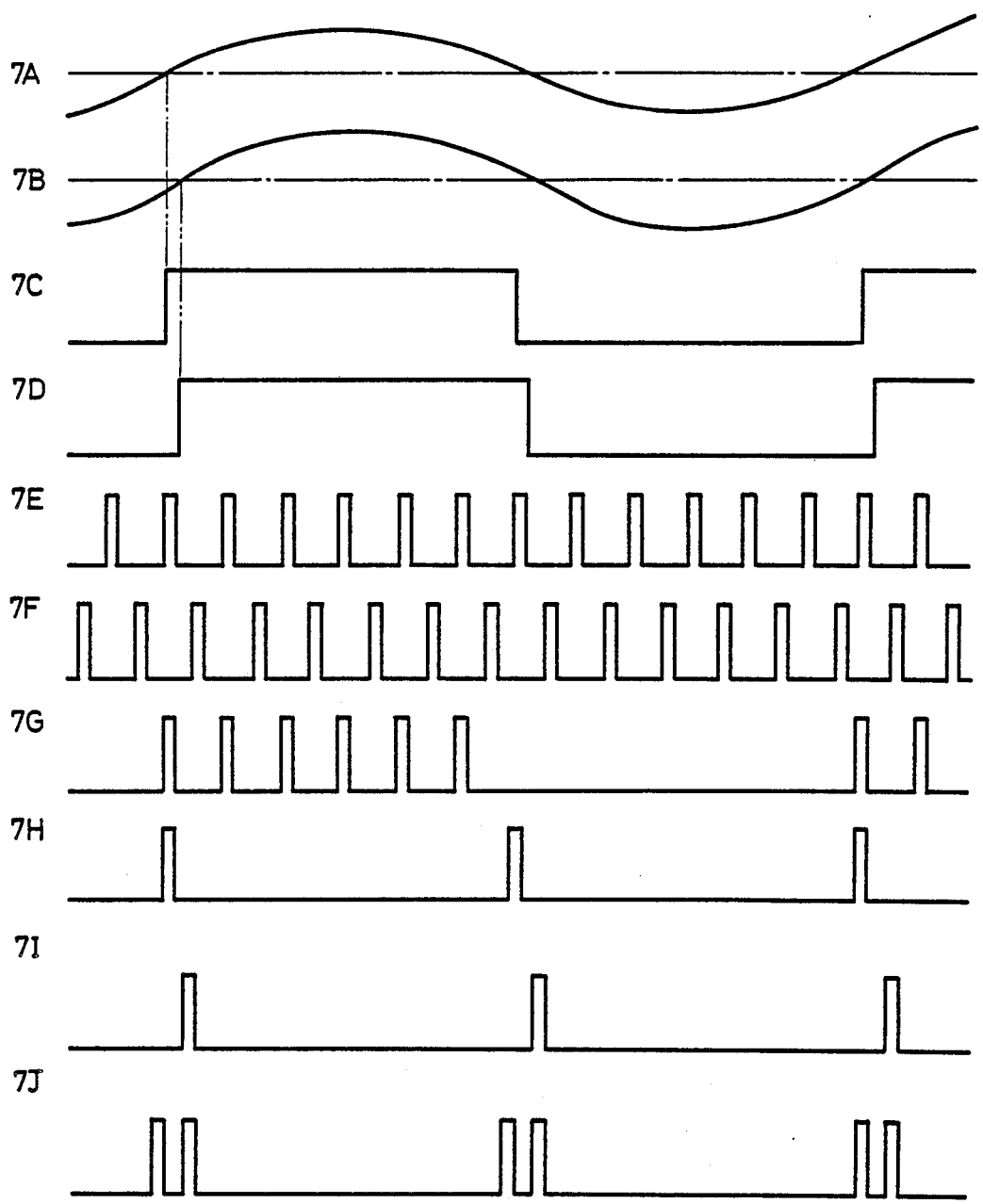
FIG. 7 shows wave forms in respective portions of the device of FIG. 6.

The rotating disk 22 and the index disk 23 are arranged such that, upon their relative movement, the photoelectric conversion elements 25A, 25B may offer, as output signals, sinusoidal photoelectric conversion signals as indicated at 7A, 7B in FIG. 7. These output signals are amplified by amplifiers 26A, 26B, for example, and are converted by Schmitt circuits 27A, 27B into rectangular wave signals as indicated respectively at 7C, 7D in FIG. 7. In order to read these rectangular wave signals in a time-shared manner, there is provided a clock pulse generator 28 for generating clock pulses as indicated at 7E and 7F in FIG. 7, which are the same in frequency with but are deviated in phase from each other, and which has the frequency higher than the repetition-frequency of each of the rectangular wave signals. Further, an edge detector 29 is provided for time-sharedly detecting, by means of each clock pulse generated from the clock pulse generator 28, the leading and trailing edges of each of the rectangular wave signals, and a single counter 30 and a display unit 31 are provided for counting and displaying the number of pulses generated from the edge detector 29.

Figure 8:
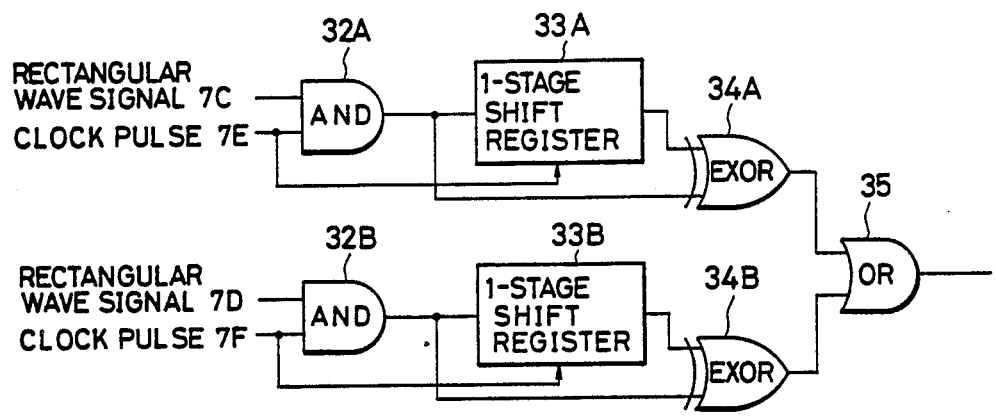
FIG. 8 is a block diagram illustrating an example of the construction of the edge detector used in the device of FIG. 6.

The edge detector 29 may have a construction as shown in FIG. 8. When the rectangular wave signals 7C shown in FIG. 7 generated from the Schmitt circuit 27A and the clock pulses 7E shown in FIG. 7 generated from the clock pulse generator 28 are inputted into an AND gate 32A to make logical products, a wave form as indicated at 7G in FIG. 7 is obtained. These pulses 7G are sent to a one-stage shift register 33A which makes shifting actions in synchronization with the clock pulses 7E. An output from this shift register 33A and the output pulses 7G from the AND gate 32A are inputted into an exclusive-OR gate, i.e. EXOR gate 34A, so that pulses having a wave form as indicated at 7H in FIG. 7 is obtained. That is to say, in correspondency to a pulse 7E which appears at the point of time substantially corresponding to the point of time when the rectangular wave signal 7C changes from "high" to "low" or from "low" to "high", a pulse having the same width as the pulse 7E is generated.

The rectangular wave signal 7D and the clock pulse 7F are also processed in a circuit comprising an AND gate 32B, a one-stage shift register 33B and an EXOR gate 34B as shown in FIG. 8, so that there is generated pulses having wave form as shown at 7I in FIG. 7, in a quite similar manner as the above. Regarding to this, since the pulses 7E, 7F are pulses with their "high" periods being phase-shifted from each other as described above, two sets of pulses 7H, 7I, which are obtained from the above-described processes, cannot coincide with each other. These two sets of pulses 7H, 7I are combined with each other in an OR circuit 35 shown in FIG. 8, and the combined pulses are outputted, as a single series of pulses as shown at 7J in FIG. 7, to the counter 30.

Operation of the above-described embodiment of this invention will now be described. Upon rotation of the rotating shaft 21 due to rotation of the rotating member, relative movement between the index disk 23 and the rotating disk 22 causes the photoelectric conversion elements 25A, 25B to generate and output the photoelectrically converted signals 7A, 7B having sinusoidal wave forms, as output shignals. These output signals 7A, 7B are respectively fed through the amplifiers 26A, 26B to the Schmitt circuits 27A, 27B, where these signals respectively converted into rectangular wave signals 7C, 7D. These rectangular wave signals have therebetween a phase difference which is determined by influences of play and/or eccentricity in the shaft, and may have wave forms as indicated at 7C, 7D in FIG. 7. These rectangular wave signals 7C, 7D are inputted to the edge detector 29. Also inputted to this edge detector 29 from the clock pulse generator 28 are clock pulses, such as clock pulses 7E, 7F shown in FIG. 7 which have the same frequency, which is several times higher than the frequency of the rectangular wave signals 7C, 7D, and which have some phase difference between them. This edge detector 29, which receives these input signals, reads the rectangular wave signals 7C, 7D in a time-shared manner by means of the clock pulses 7E, 7F as described above, and outputs a pulse 7J at each point of time when each rectangular wave signal varies. The pulse 7J is sent to the single counter 30 which counts the number of the pulses, and the counted value is bisected and displayed by the display unit 31. By this bisection of the counted value, a value which is deprived of influences due to play and/or eccentricity of the shaft can be obtained. It will be noted that, if the counted value is displayed as it is without bisection, then a value of apparently doubled resolution will be displayed.

The measurement of rotational angle of the rotating member has been described in the above as one embodiment of this invention, but according to the invention, rotational speed of a rotating member can also be measured in a similar manner. Next, explanation will be made on an embodiment of this invention, wherein rotational speed of a rotating member is measured.

In principle, if rotational angle can be measured as in the above-described embodiment of the invention, rotational speed of a rotating body can then be measured by providing a simple additional circuit and the like. It will be noted that rotational speed can be measured, for example, by counting pulses obtained from the above-described time-shared detection and representing an amount of angular displacement, and clock pulses which represent the time required for such amount of angular displacement.

Figure 9:
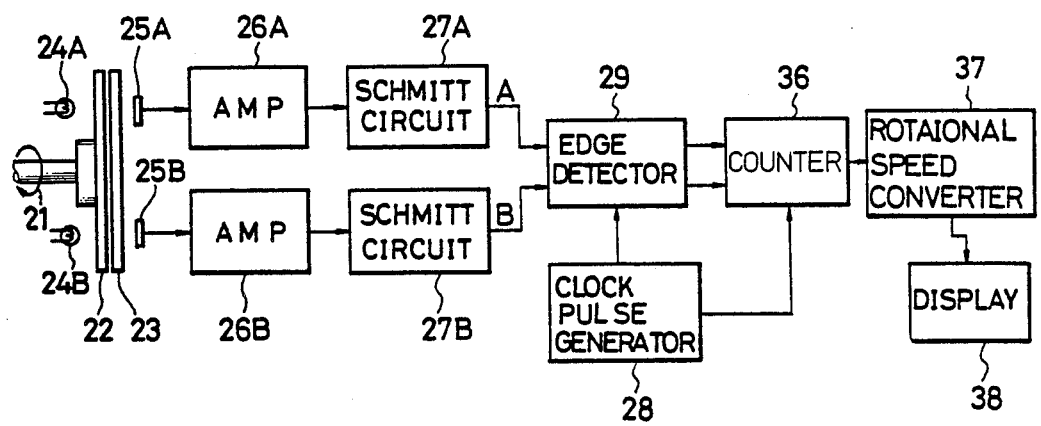
FIG. 9 is a block diagram illustrating the construction of another embodiment of the photoelectric type device for measuring rotational speed in accordance with this invention.
Figure 10:
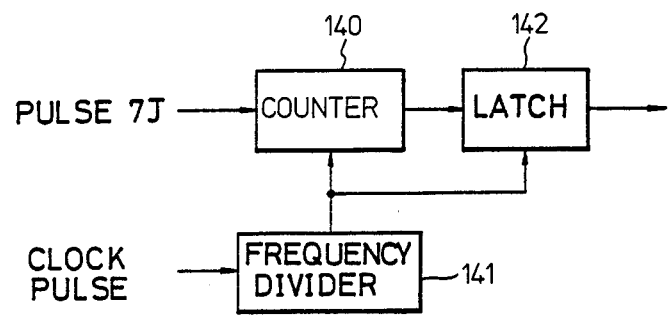
FIG. 10 is a block diagram illustrating an example of the construction of the rotational speed measuring counter used in the device shown in FIG. 9.

FIG. 9 is a block diagram illustrating an embodiment of this invention for measuring rotational speed. In FIG. 9, like parts as those shown in FIG. 6 are indicated by the same symbols, and accordingly detailed description thereof will be omitted. In FIG. 9, a counter 36 for measuring rotational speed is provided in place of the counter 30 used for measuring rotational angle in FIG. 6. This counter 36 is adapted to receive output signals from the edge detector 29 and clock pulses from the clock pulse generator 28, simultaneously. An example of the detailed construction of the counter 36 is illustrated in FIG. 10. Referring to FIG. 10, clock pulses from the clock pulse generator 28 are inputted to and divided by a divider 141, which serves as a frequency divider. This divider 141 outputs pulses at intervals of a predetermined number of clock pulses. This predetermined number and the frequency of the clock pulses determine measurement intervals. Thus, for example, if a clock pulse of the frequency of 200 KHz is used and an output pulse is generated once every 50 clock pulses, the output pulses are generated at the rate of one pulse per 250 μsec. On the other hand, pulses 7J, which are outputted from the edge detector 29 and represent rotational angular displacement, are counted by a counter 140, and the counted value is latched in a latch circuit 142 every time the frequency divider 141 generates its output pulse. At the same time, the counter 140 is cleared by the pulse from the frequency divider 141 and begins new counting. The data latched in the latch circuit 142 is sent to a rotational speed-converting circuit 37 shown in FIG. 9, where the counted value is converted into a value of rotational speed and be displayed by an display unit 38. Accordingly, a mean speed over the period of 250 μsec will be displayed.

Figure 11:
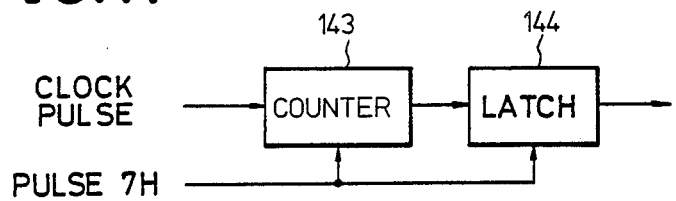
FIG. 11 is a block diagram illustrating another example of the construction of the rotational speed measuring counter used in the device shown in FIG. 9.

In the above-described embodiment, the example has been described wherein pulses representing amount of angular displacement are counted on the basis of clock pulses for time counting, but, alternatively, clock pulses representing time may of course be counted on the basis of pulses representing amount of angular displacement. In this case, provision is made as shown in the block diagram of FIG. 11, for example, wherein clock pulses are counted by a counter 143, and the counted value is latched in a latch circuit 144 by means of pulses 7H or 7I from the edge detector 29. At the same time, the counter 143 is cleared. The arrangement of FIG. 11, however, is adapted to measure the time for a unit amount of movement, and accordingly, when the rotating disk 22 is at rest, no pulse which serves as a trigger will be generated, thus allowing the counter 143 to continue its incremental counting, resulting in an inconvenience. For avoiding such inconvenience, it will be noted that additional process may be made for converting rotational speed to 0 when the length of interval between pulses has exceeded a predetermined length, for example.

According to the above-described embodiments of this invention, respective signals obtained from at least two sensing elements, which are located at substantially rotationally symmetrical positions on a rotating disk, are individually converted to rectangular waves, which are then processed in time-shared detection manner using a common pulse generator and a common counter, so that highly accurate measurement of rotational angle and/or rotational speed can be made by means of simple construction having none of differentiating circuit, averaging circuit or the like, without being affected by play and/or eccentricity in the rotating shaft of the rotating member.

Figure 12:
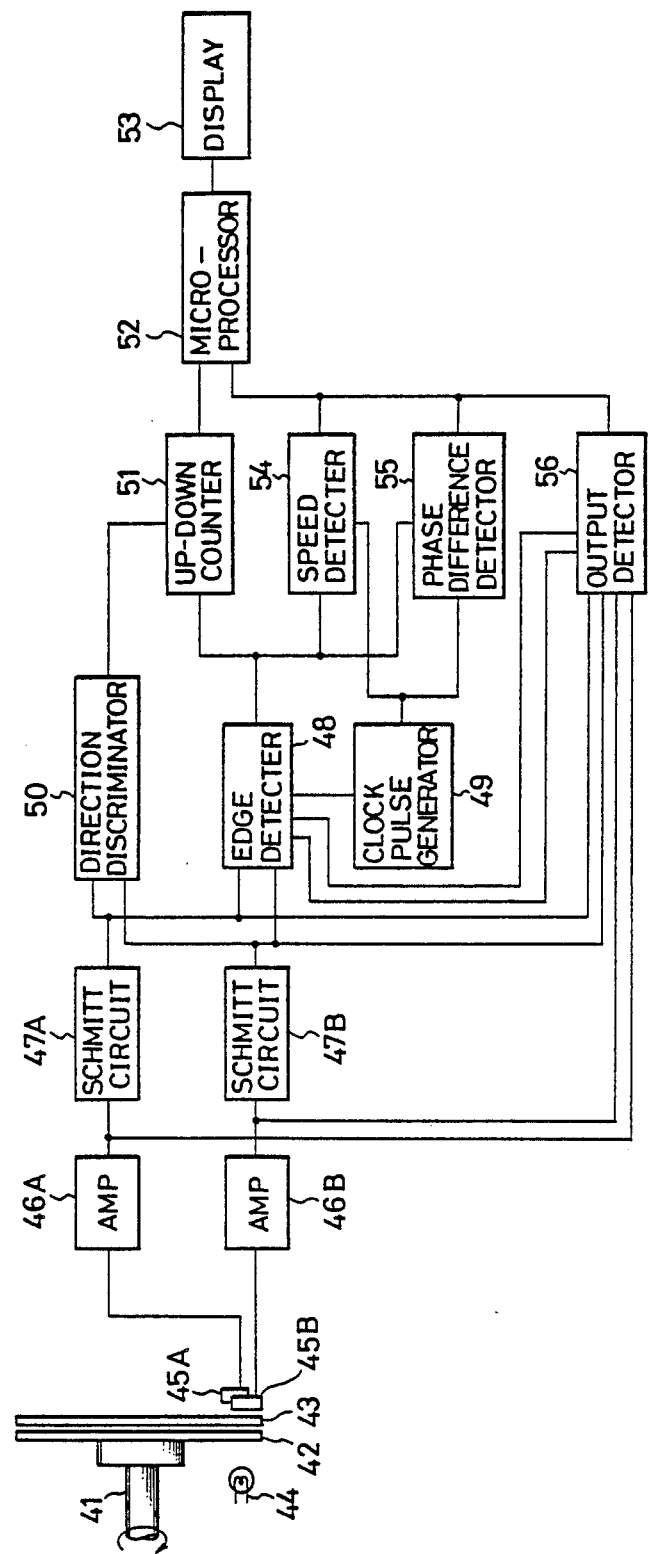
FIG. 12 is a block diagram illustrating the construction of another embodiment of the photoelectric type rotational angle measuring device in accordance with the invention.

FIG. 12 is a block diagram illustrating a further embodiment of the displacement measuring device in accordance with this invention for measuring rotational angle in a photoelectric manner. Secured to a rotating shaft 41, which is an object to be measured, is a rotating coding disk 42 in a substantially concentric relationship for rotation together with the rotating shaft 41. The rotating coding disk 42 is similarly to the rotating disk shown in FIG. 2, and has radial slit gratings arranged annularly at equal angular pitches P. A non-rotating index disk 43 is provided opposite to and in a concentric relationship with the rotating coding disk 42. The index disk 43 is provided with index slit gratings 43A, 43B which have therebetween an angular difference of $$\frac{4n + 1}{4} P$$

Figure 13:
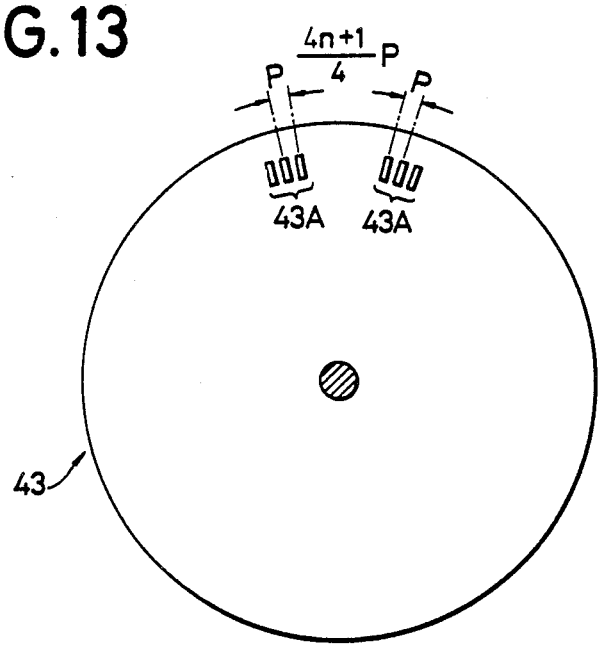
FIG. 13 is a plan view of the index disk used in the device shown in FIG. 12.
Figure 14:
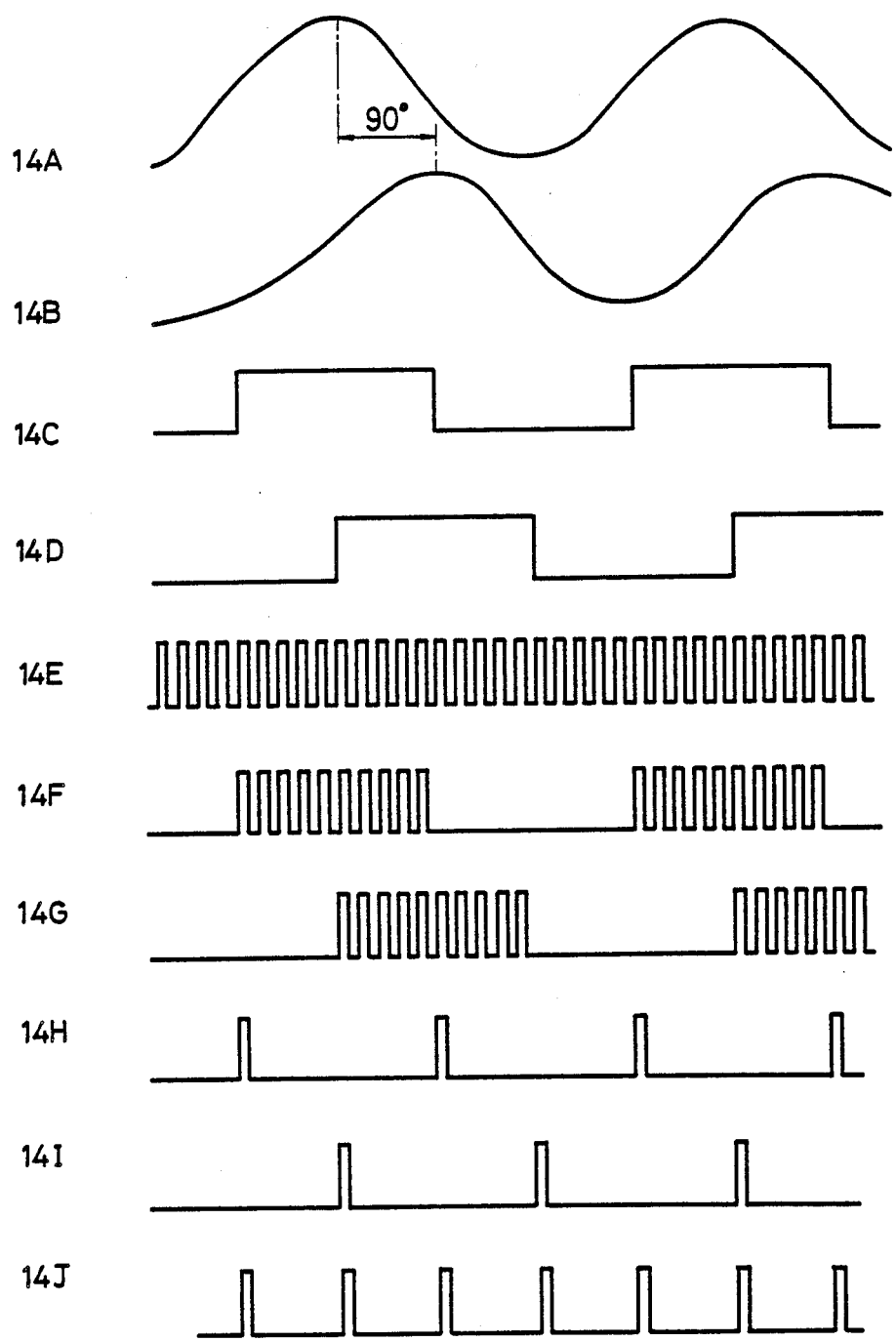
FIG. 14 shows wave forms in respective portions of the device shown in FIG. 12.

(where n is an integer), i.e. a phase difference of 90°, as shown in FIG. 13. A light source 44 and photoelectric conversion elements 45A, 45B are arranged in such a manner that the index gratings 43A, 43B and the rotating coding disk 42 are interposed therebetween. Upon rotation of the rotating shaft 41, the photoelectric conversion elements 45A, 45B respectively generate sinusoidal detection signals having therebetween a phase difference of 90° as indicated at 14A and 14B in FIG. 14. These detection signals 14A, 14B are amplified by amplifiers 46A, 46B, for example, and are converted by Schmitt circuits 47A, 47B into rectangular wave signals indicated respectively at 14C and 14D in FIG. 14. An edge detector 48 receives these rectangular wave signals, and also receives clock pulses which are supplied from a clock pulse generator 49 and which are higher in frequency than each of the rectangular wave signals. Then, the edge detector 48 outputs clock pulses which coincide with the leading and trailing edges of each of the rectangular wave signals. This edge detector 48 may be constructed in a similar manner to the edge detector shown in FIG. 8, for example. In this case, however, the rectangular wave signal 14E is supplied, together with clock pulses 14C from the clock pulse generator 49, to the AND gate 32A, and on the other hand the rectangular wave signal 14D is supplied together with the clock pulses 14E to the AND gate 32B. As a result, these AND gates 32A, 32B respectively generate output signals having wave forms indicated at 14F, 14G in FIG. 14. These signals 14F, 14G are respectively sent to the one-stage shift register 33A, 33B which make shifting actions synchronously with the clock pulses 14E, and outputs of these shift registers 33A, and 33B and the signals 14F and 14G are applied to the exclusive-OR gates, i.e. EXOR gates 34A, 34B, respectively. As a result, the EXOR gates 34A, 34B respectively output clock pulses which, as indicated at 14H, 14I in FIG. 14, have therebetween a phase difference of 90° and substantially coincide in timing with the leading and trailing edges of the two rectangular waves 14C, 14D. Upon supplying these clock pulses to the OR gate 35, it supplies a single series of output pulses as indicated at 14J in FIG. 14.

The outputs from the Schmitt circuits 47A, 47B are also sent to a direction discrimination circuit 50. This direction discrimination circuit makes discriminations in such a manner that, for example, if the signal 14C is at a high level at the moment corresponding to the leading edge of the signal 14D, then it is of forward direction, and that, if the signal 14C is at a low level at such moment, then it is of reverse direction. The circuit 50 outputs a direction signal to an up-down counter 51.

This counter 51 up-down counts the output pulses 14J from the edge detector 48 in accordance with the indication of the direction signal. The counted value of the counter 51 is then converted into an angular value by a microprocessor 52 and is displayed by a display unit 53.

Figure 15:
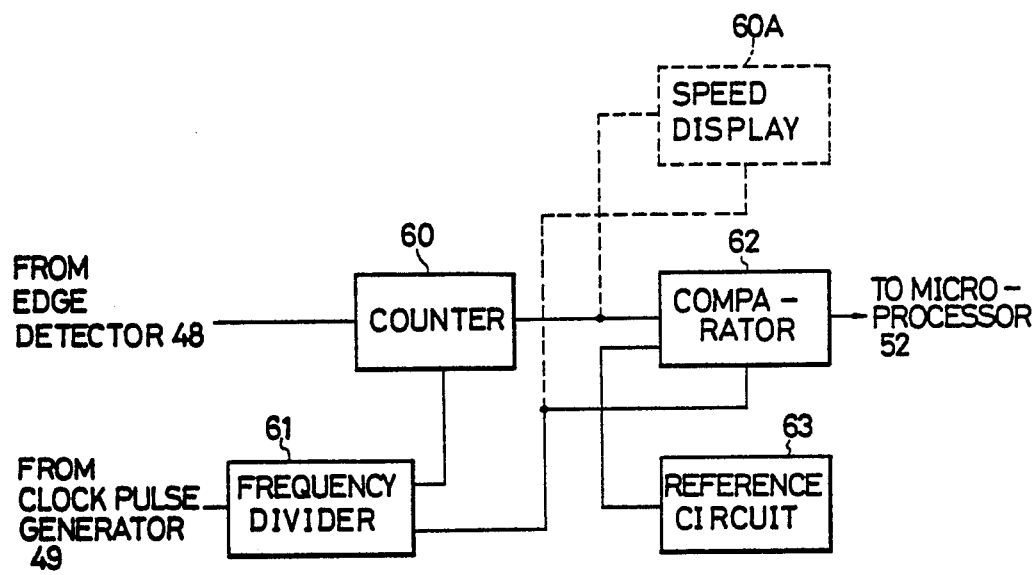
FIG. 15 is a block diagram of the speed detection device used in the device shown in FIG. 12.

The output pulse 14J and the clock pulse 14E are also supplied to a speed detection unit 54 and a phase difference detection unit 55, and the detection signals 14A, 14B, the rectangular wave signals 14C, 14D and the single pulses 14H, 14I are supplied to an output detection unit 56. The speed detection unit 54 may have a construction as shown in FIG. 15, for example. The pulse 14J from the edge detector 48 are counted by a counter 60. On the other hand, the clock pulses 14E are frequency-divided, by a frequency divider 61 consisting of a counter, into pulses having predetermined time interval and are then applied as clearing signals to the counter 60. The counted value of the counter 60 is always compared by a comparator 62 with a value set by a reference circuit 63, and, when the counted value is larger than the set value, then a signal of "high" is outputted. This output is latched at the microprocessor 52, and an indication of speed error is given by the display unit 53 shown in FIG. 12. As will be seen from the broken lines, indication of displacement speed can be made by a speed display unit 60A which reads the counted values of the counter 60 every clearing signal from the frequency divider 61.

Figure 16:
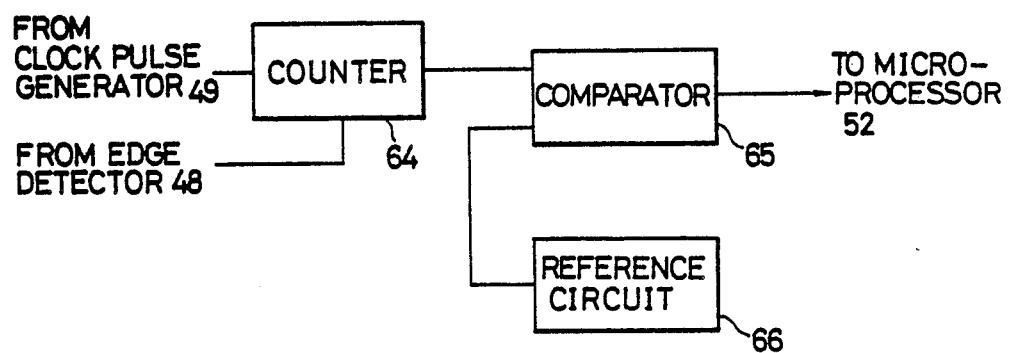
FIG. 16 is a block diagram of the circuit of the phase difference detection device used in the device shown in FIG. 12.

The phase difference detection unit 55 may have a construction as shown in FIG. 16, for example. The clock pulses 14E generated from the clock pulse generator 49 are counted by a counter 64. On the other hand, the output pulses 14J from the edge detector 48 are supplied as clearing signals for the counter 64. The counted value of the counter is always compared with a value set by a reference circuit 66, and, if the counted value is larger than the set value, then a signal of "high" is outputted. This output is latched at the microprocessor 52, and a display of phase difference error is made by the display unit 53 shown in FIG. 12. If the phase lag of the detection signal 14B with respect to the detection signal 14A becomes larger than 90°, then the phase difference between the respective leading edges of two rectangular wave signals 14C, 14D becomes correspondingly larger than 90°. On the contrary, if the lag of phase of the detection signal 14B with respect to the detection signal 14A becomes smaller than 90°, then the phase difference between the leading edge of one of two rectangular wave signals 14C, 14D and the trailing edge of the other becomes larger than 90°. Accordingly, by counting the clock pulses 14E while clearing with the output pulses 14J, and comparing the counted value with the set value, discrimination can be made whether the phase difference has been out of a proper range or not.

Figure 17:
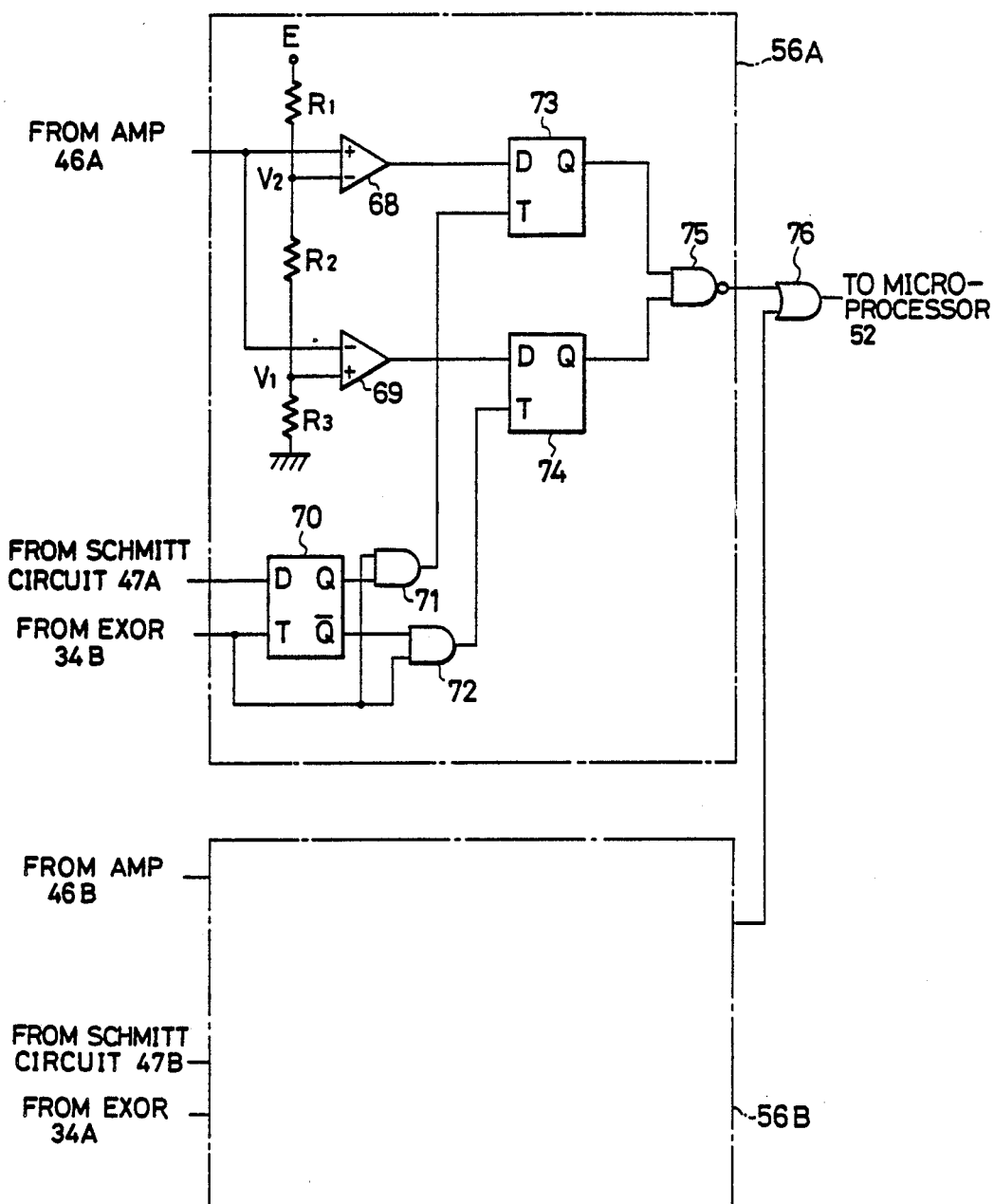
FIG. 17 is a block diagram of the circuit of the output detection device used in the device shown in FIG. 12.

The output detection unit 56 may be composed of a pair of output detectors 56A, 56B as shown in FIG. 17, for example. The output detectors 56A and 56B are identical to each other in construction and operation except that different signals are inputted to them, and accordingly only the output detector 56A will now be described.

The output detector 56A detects the output levels of the detection signals 14A. The sinusoidal detection signal 14A is inputted to one input of each of comparators 68, 69. On the other hand, resistors $R_1$, $R_2$, $R_3$ cooperate to produce predetermined voltages $V_1$, $V_2$. $V_2$ is made to take a value $M_1$ which is slightly lower than the maximum value of a normal detection signal, as shown at 14A in FIG. 18, and $V_1$ is made to take a value $M_2$ which is slightly higher than the minimum value of the same normal detection signal. These voltages $V_1$, $V_2$ are inputted to the other inputs of the comparators 68, 69, respectively. The comparator 68 outputs "HIGH" signal when the level of the sinusoidal detection signal 14A is larger than the predetermined value $V_2$, and the comparator 69 outputs "HIGH" signal when the level of the sinusoidal detection signal 14A is smaller than the predetermined value $V_1$.

Figure 18:
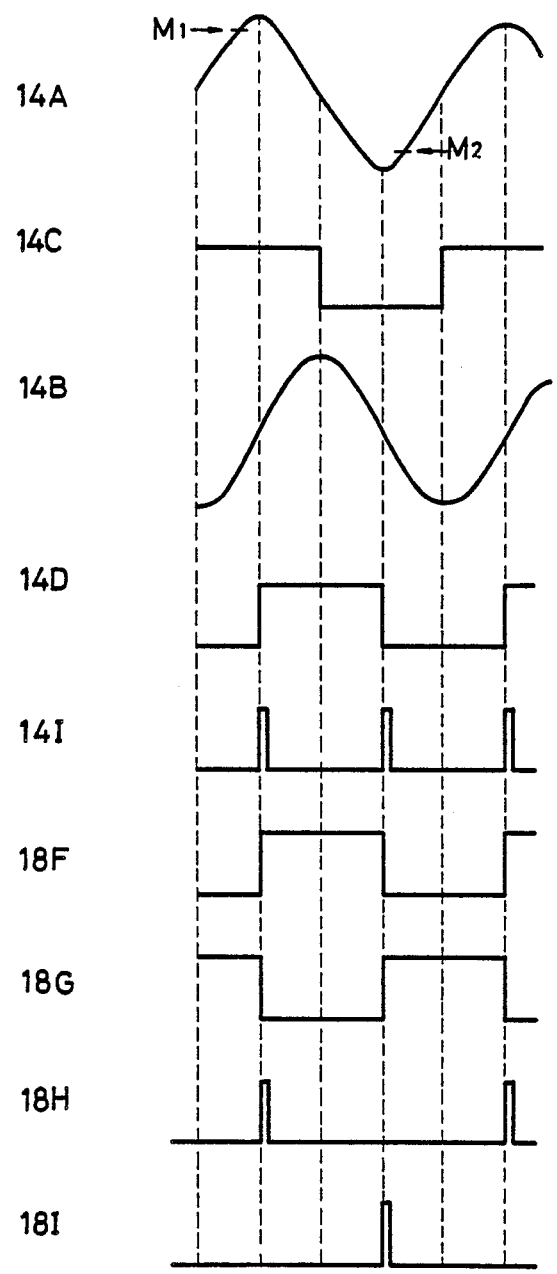
FIG. 18 shows wave forms in respective portions of the circuit shown in FIG. 17.

As is seen from FIG. 18, the maximum value of the sinusoidal detection signal 14A is of timing for the leading edge of the output signal obtained from the Schmitt circuit 47B, i.e. the rectangular wave signal 14D, and the minimum value of the sinusoidal detection signal is of timing for the trailing edge of the same signal.

In order to detect output states of the comparators 68 and 69 at such timings, the rectangular signal 14C is inputted to a D terminal of a flip-flop 70, and signal pulses 14I outputted from the EXOR circuit 34B of the edge detector 48 are inputted to a T terminal of the flip-flop. Q output of the flip-flop 70 is inputted to one of the inputs of an AND circuit 71, and the output 14I of the EXOR circuit 34B is inputted to the other input of the AND circuit 71. $\overline{Q}$ output of the flip-flop 70 is inputted to one of the inputs of an AND circuit 72, and the output of the EXOR circuit 34B is inputted to the other input of the AND circuit 72. Accordingly, the flip-flop 70 outputs from its Q terminal the state of pulse 14C inputted to the D terminal at the time corresponding to the leading edge of the pulse 14I inputted to the T terminal, the wave form of the output Q is as indicated at 18F in FIG. 18. The wave form of the output at the $\overline{Q}$ terminal is as shown at 18G in FIG. 18, and therefore is the inversion of the wave form 18F.

The AND circuits 71 makes a logical product of the output 18F at the Q terminal of the flip-flop 70 and the output 14I of the EXOR circuit 34B, and outputs pulses having a wave form as shown at 18H in FIG. 18. The timing for the high level of these pulses corresponds to the time when the sinusoidal detection signal 14A takes its maximum value. On the other hand, the AND circuit 72 receives the pulses 14I and 18G, and outputs pulses which correspond to the time when the sinusoidal detection signal 14A takes its minimum value, as shown at 18I in FIG. 18.

The output of the AND circuit 71 is inputted to a T terminal of a flip-flop 73 having D terminal is connected to receive the output of the comparator 68. The flip-flop 73 outputs from its Q terminal a comparison result of the comparator 68 indicating whether the sinusoidal detection signal 14A is larger than the predetermined value $V_2$ or not when it take its maximum value. In this embodiment, when the maximum value of the sinusoidal detection signal 14A is larger than the predetermined value $V_2$, the above mentioned output becomes "HIGH". On the other hand, the output of the AND circuit 72 is inputted to a T terminal of a flip-flop 74 having D terminal is connected to the output of the comparator 69. The flip-flop 74 outputs a "HIGH" output when the minimum value of the sinusoidal detection signal 14A is smaller than the predetermined value $V_1$. The outputs of the flip-flops 73 and 74 are inputted to a NAND circuit 75, thereby to generate a "LOW" output only when the maximum value of the sinusoidal detection signal 14A is higher than the predetermined value and the minimum value is smaller than the another predetermined value, or to generate a "HIGH" output under otherwise conditions, that is, when the output of the photoelectric conversion element becomes abnormal due to some cause.

In such a manner, detection for level of the sinusoidal detection signal 14A is made by the output detector 56A, while detection for level of the sinusoidal detection signal 14B is made by the output detector 56B in a similar manner, and the results are inputted to an OR circuit 76, thus allowing detection of an abnormality which may take place in either of the two signals.

The OR circuit 76 is connected through the microprocessor 52 to the display unit 55, which in turn makes a display when an abnormality has been detected.

It will be apparent to those skilled in the art that, in one of the above-described embodiments of the displacement measuring device in accordance with this invention, if the measurement accuracy required is not very high, then the edge detector 48 may output, to the counter 51 and the speed detection unit 54, only pulses which correspond to the leading and trailing edges of either of the two rectangular waves 14C, 14D, or more simply, may output only pulses which correspond to either of the leading and trailing edges.

In the embodiment of FIG. 12, pulses which correspond to the leading and trailing edges of the first and second rectangular wave signals 14C, 14D have been obtained from the same series of clock pulses. But, if rotational speed of the rotating shaft 41 becomes too high, then there is a possibility that clock pulses which correspond respectively to the leading edges or trailing edges of the first and second rectangular wave signals 14C, 14D will go into the same one. In this regard, it is possible to make pulses, which correspond to the leading and trailing edges of the first and second signals, to be always different in phase from each other.

Figure 19:
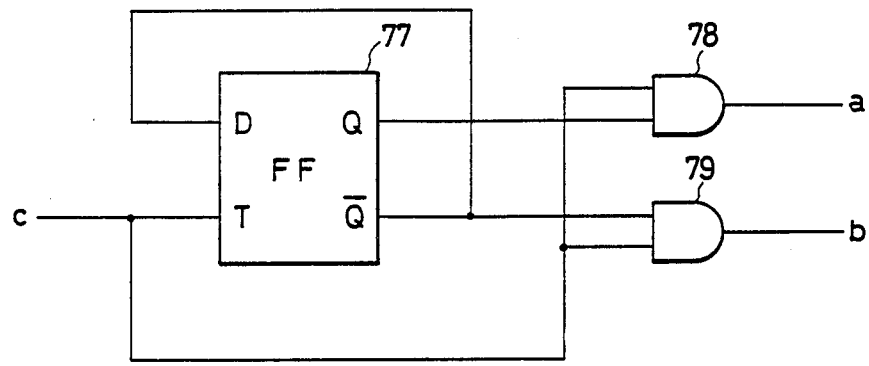
FIG. 19 is a block diagram illustrating a modified example of the clock pulse generator shown in FIG. 12.
Figure 20:
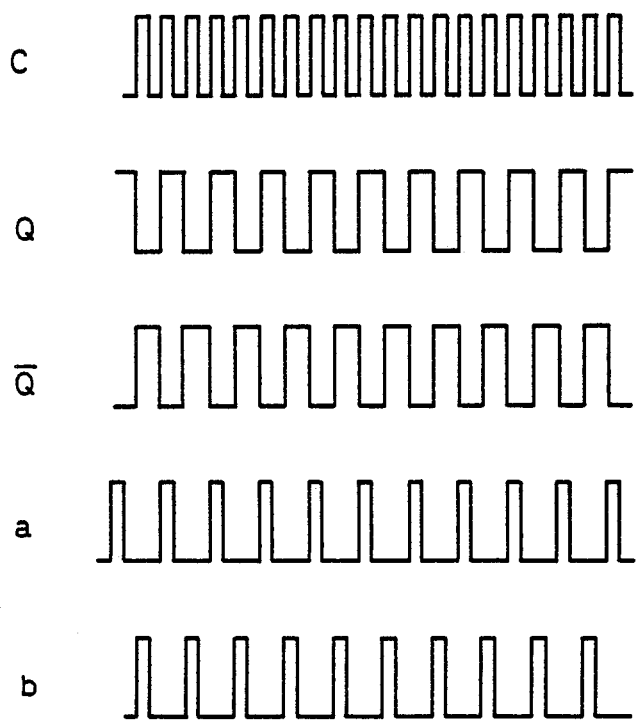
FIG. 20 shows wave forms in respective portions of the circuit of FIG. 19.

For example, by means of a circuit having a construction as shown in FIG. 19, two pulse signals a, b, which are the same in period but different in phase with respect to each other, can be obtained from single-frequency pulses C as shown in FIG. 20, and are inputted respectively to teh AND gates 32A 32B of FIG. 8.

This circuit is composed of a D type flip-flop 77 and two AND circuits 78, 79. The D type flip-flop 77 receives, at its T terminal, clock pulses such as pulses generated from the clock pulse generator of FIG. 12, performs ½ frequency-dividing on them, and outputs a non-inverted output and an inverted output from its Q and $\overline{Q}$ terminals, respectively. The Q output and $\overline{Q}$ output are inputted to one of inputs of the AND circuits 78, 79, respectively, and also the $\overline{Q}$ output is inputted to a D terminal of the D type flip-flop. Inputted to the other inputs of the two AND circuits are the clock pulses C from the clock pulse generator. Thus, obtained from the AND gates 78 and 79 are desired signals a, b which are different in phase from each other so that moments of their high levels do not coincide with each other. In this case, it can be considered that the clock pulse generator of FIG. 12 and the circuit to FIG. 19 are combined with each other to constitute a single pulse generator. This combined pulse generator can be used as the pulse generator 28 in FIG. 6.

Output pulses of the EXOR gates 34A, 34B, which can be obtained by inputting the signals a, b respectively to the AND circuits 32A, 32B of FIG. 8 as described above, will, because of difference in phase between the input pulses, not coincide with each other even if the leading and trailing edges of the rectangular wave signals 14C, 14D from the Schmitt circuits 47A, 47B coincide with each other, and accordingly the counter 51 can always perform discriminatable countings, thus enlarging tolerance for phase dispersion.

Further, in the embodiment of FIG. 12, output level detection and phase detection of the outputs from the photoelectric conversion elements have been made separately. But, it will be seen from FIG. 18 that, if phase difference between two sinusoidal detection signals deviates from 90°, then the leading and trailing edges of the rectangular wave signal will also deviate from the maximum and minimum values of the sinusoidal signal by an amount which corresponds to the amount of deviation in the phase difference. Accordingly, if allowable value for the deviation of phase difference is set and suitable maximum and minimum values for that allowable value are determined, then the output level detection and phase detection of the outputs from the photoelectric conversion elements can be made together.

As described above, according to the invention, pulses which represent the leading and/or trailing edges of the rectangular wave signal can be generated by means of a digital circuit, without use of a differentiating circuit incorporating a CR circuitry and the like, and accordingly measurement of displacement can be made with high reliability, being less subjected to influence of change in temperature.

Further, according to the invention, no differentiating circuit, which may make the arrangement more complex, is required, thus allowing a compact electronic device portion.

If the phase difference between two detection signals, which should be 90°, becomes smaller by reason of deviation in position of the coding member, the index slits or the light receiving element, then the interval between pulses which represent the leading and/or trailing edges of the signals becomes smaller, so that the counter may possibly become incapable of discriminating individual pulses from each other, thus causing possible erroneous counting of the counter. According to this invention, however, phase difference between two signals is detected, and, if an abnormal phase difference is detected, then this is displayed by the display unit, and accordingly correct measurement can be insured.

If the displacement speed of the coding member is too high, then the electric circuit and the like cannot respond to the change to such high speed, thus causing erroneous counting. According to this invention, however, such displacement speed is detected, and if the displacement speed exceeds a predetermined value, then this is displayed by the display unit, and accordingly correct measurement can be insured.

If the output level of the light receiving element is decreased or if the variation range of such output is reduced due to soil on the light emitting portion, the index slits or the light receiving element, or by reason of decrease in the input voltage supplied to the light emitting element or abnormality in the light emitting element, then detection of the change in the "0" and "1" coding pattern of the coding member becomes difficult, resulting in erroneous counting. According to this invention, however, such abnormalities in the output of the light receiving element are detected by comparing the maximum and minimum values of the output of the light receiving element with predetermined values, and such abnormal output is displayed by the display unit, so that erroneous measurement can be avoided.

Figure 21:
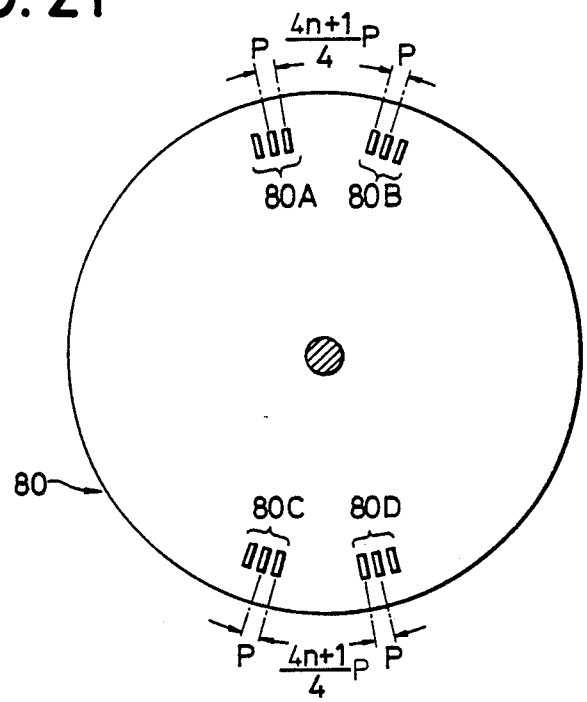
FIG. 21 is a plan view illustrating a modified example of the index disk.

In place of the index disk 3 shown in FIG. 3 or the index disk 43 shown in FIG. 13, an index disk 80 as shown in FIG. 21 may be employed. This index disk 80 has therein four sets of index gratings 80A, 80B, 80C, 80D. A group of index gratings 80A and 80B and another group of index gratings 80C, 80D are opposite to each other in a diametrical direction, that is, are located at rotationally symmetric positions. The index gratings in each group are closely located with respect to each other with an angular difference of $$\frac{4n+1}{4} P$$

Figure 22:
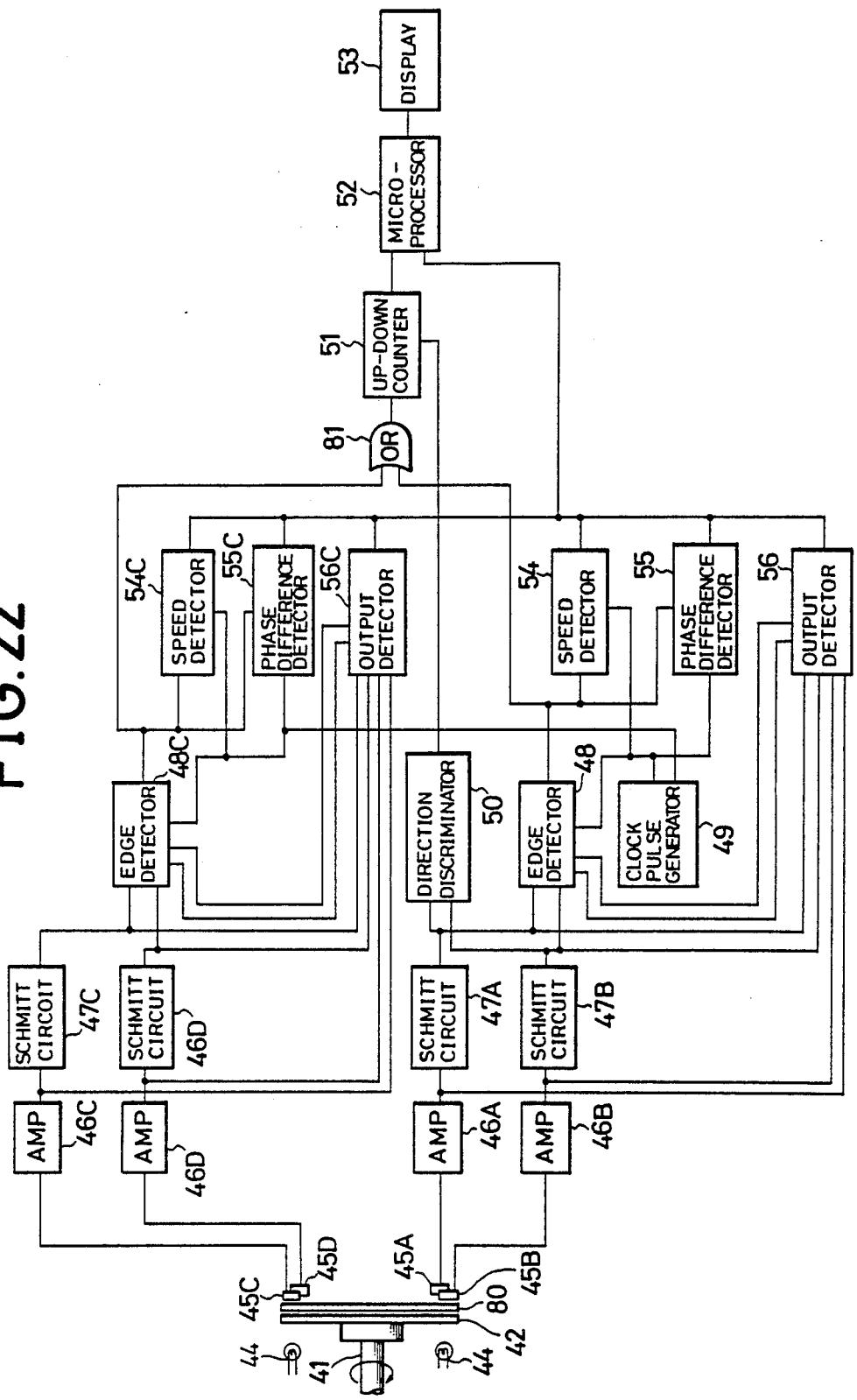
FIG. 22 is a block diagram illustrating the construction of a further embodiment of the photoelectric type rotational angle measuring device in accordance with this invention.

(where n is an integer) therebetween so that associated sensing elements may output signals with a phase difference of 90° therebetween. An embodiment of the rotational angle measuring device which employs such index disk 80 is shown in FIG. 22. In the block diagram of FIG. 22, devices similar to those shown in FIG. 12 are indicated by like reference numerals having suffixes "C" and "D" added to them, and accordingly detailed description thereof will be omitted. As will be seen from comparison of FIG. 22 with FIG. 12, photoelectric conversion elements 45A, 45B which correspond to the index gratings 80A, 80B, and photoelectric conversion elements 45C, 45D which correspond to the index gratings 80C, 80D are associated respectively with electronic circuit systems similar to the circuit system of the device shown in FIG. 12. However, since it is sufficient if only one direction discrimination circuit is provided for discriminating directions, the circuit system for the photoelectric conversion elements 45C, 45D has no direction discrimination circuit provided thereto. In order to assure that the pulses outputted from the edge detectors 48 and 48C may not coincide with each other, there is provided only one clock pulse generator 49 capable of supplying to the edge detectors 48 and 48C two series of clock pulses such as pulses, a, b shown in FIG. 20, respectively. And, the output pulses from the edge detectors 48, 48C are supplied through an OR gate 81 to the an up-down counter 51.

With the device constructed as the above, each of signals obtained from the sensing elements located at substantially rotationally symmetric positions against the rotating disk is independently converted into a rectangular wave, and then these converted rectangular waves are processed by means of the common pulse generator and counter in the time-shared detecting manner. Accordingly, rotational angle and/or rotational speed can be measured with a high accuracy, with a simple arrangement without use of a differentiating circuit and an averaging circuit, and without being subjected to the influence of play or eccentricity in the rotating shaft of a rotating body.

Figure 23:
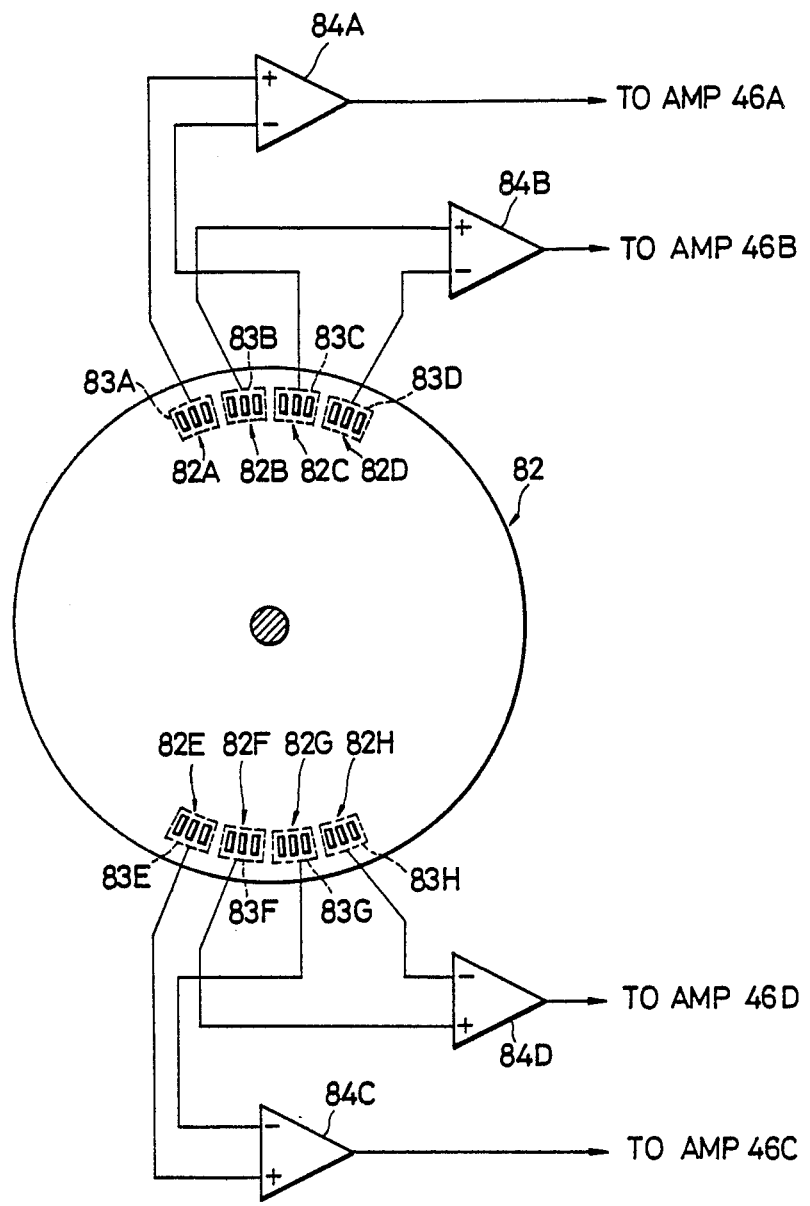
FIG. 23 is a plan view illustrating a further modified example of the index disk.

The index disk may alternatively have a construction as shown in FIG. 23. This index disk 82 has therein a first group consisting of gratings 82A, 82B, 82C, 82D and a second group consisting of gratings 82E, 82F, 82G, 82H, which groups are arranged in a diametrically opposing fashion with respect to each other, that is, located at rotationally symmetric positions. The gratings in each group are closely arranged with respect to adjacent gratings with an angular difference of $$\frac{4n+1}{4}P$$

therebetween. Accordingly, if sensing elements 83A to 83H are arranged as indicated by the dotted lines, then, with respect to outputs from the sensing elements 83A, 83E, outputs from the sensing elements 83B, 83F have a phase difference of 90°, outputs from the sensing elements 83C, 83G have a phase difference of 180°, and outputs from the sensing elements 83D, 83H have a phase difference of 270°. Now, in this embodiment, outputs from each pair of the sensing elements whose outputs have a phase difference of 180° therebetween are inputted to one of differential amplifiers 84A, 84B, 84C, 84D. These differential amplifiers are connected at their output to the amplifiers 46A, 46B, 46C, 46D in FIG. 22, respectively. With this arrangement, by differentially combining the signals which have the phase difference of 180° therebetween, there can be obtained 0°-phase and 90°-phase signals which have been deprived of direct current components and been doubled in sensibility. Therefore, it is possible to compensate for variation in detection signals which would be caused at the time of measurement by external disturbances such as, variation in the light source, irregularity in the radial gratings, variation in the environment temperature, variation in the source voltage and the like.

Figure 24:
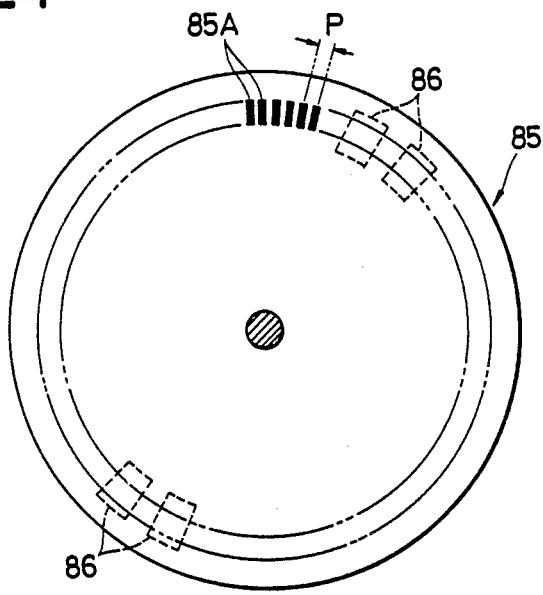
FIG. 24 is a plan view illustrating an example of the magnetic rotating code disk.

The above-described embodiments are of the photoelectric type of measuring apparatus wherein a light source is employed as the radiation source, radial gratings and index gratings are used as the coding pattern, and photoelectric conversion elements is provided as the detection elements. This invention, however, is not limited to the photoelectric type but also can be applied to other types of measuring apparatus. In case of applying this invention to a magnetic type of measuring apparatus, for example, no index disk is employed, and there is used only a rotating disk 85 having magnetic segments 85A annularly arranged at equal angular pitches P so as to form magnet lattices as shown in FIG. 24. And, magnetic heads 86 are arranged as sensing elements as shown by the dotted lines. In this case, the magnetic heads may be arranged in a diametrically opposing fashion with respect to each other, or alternatively be closely arranged so that output signals may be generated with a 90° phase difference therebetween.

We claim:

1. A device for measuring displacement comprising a coding member carried by an object to be measured and having a coding section capable of causing sensing elements to generate signals which can be discriminated as "0" and "1", and sensing means arranged to sense the coding section of the coding member and adapted to generate detection signals in response to displacement of the coding member, so that the detection signals are counted for measurement of displacement, the sensing means including first and second sensing elements arranged to generate first and second detection signals with a phase difference of 90° therebetween; first and second rectangular wave-converting circuits for receiving respectively the first and second detection signals to generate respectively first and second rectangular wave signals; a clock pulse generator for generating clock pulses of a frequency higher than the frequency of the first and second detection signals; an edge detector for receiving the clock pulses and at least one of the first and second rectangular wave signals to output, as output pulses, clock pulses coinciding with at least one of the leading and trailing edges of the first and second rectangular wave signals; a speed detecting device which has a speed detector including a counter adapted to receive the output of the edge detector and be cleared every predetermined period of time, a comparator adapted to receive a counted value from the counter and a set value from a speed setting unit for outputting a signal when the counted value has exceeded a set value and a display unit adapted to make a display when the comparator has outputted the signal; the counter of the speed detector being adapted to count the output pulses from the edge detector and be cleared by a frequency-divided pulses obtained by frequency-dividing the clock pulses from the clock pulse generator.

2. A device for measuring displacement according to claim 1 wherein the coding member is a rotating disk joined to a rotating shaft of the object to be measured, its coding section being provided annularly in the rotating disk, and the first and second sensing elements of the sensing means are arranged with respect to the coding section of the rotating disk, in such a manner that they generate respectively said first and second detection signals with a phase difference of 90° therebetween in response to rotational motion of the rotating disk.

3. A device for measuring displacement according to claim 2 wherein the coding section of the rotating disk is formed with optically transparent slit gratings arranged at predetermined angular pitches; the sensing elements are photoelectric conversion elements; a stationary index disk is adjacent the rotating disk, the index disk is formed with, at positions corresponding to the optically transparent slit gratings of the rotating disk, optically transparent index gratings of the number corresponding to the number of the photoelectric conversion elements; and the photoelectric conversion elements and respective light sources are arranged in a manner that the corresponding index grating and slit grating are interposed therebetween.

4. A device for measuring displacement according to claim 2 wherein the coding section of the rotating disk is formed with magnetic segments arranged at predetermined angular pitches, the sensing elements being magnetic heads arranged to detect the magnetic segments.

* * * * *